United States Patent [19]

Watari et al.

[11] Patent Number: 4,744,007
[45] Date of Patent: May 10, 1988

[54] HIGH DENSITY LSI PACKAGE FOR LOGIC CIRCUITS

[75] Inventors: Toshihiko Watari; Junzo Umeta, both of Tokyo, Japan

[73] Assignee: NEC Corporation, Tokyo, Japan

[21] Appl. No.: 896,348

[22] Filed: Aug. 14, 1986

Related U.S. Application Data

[63] Continuation of Ser. No. 593,126, Mar. 26, 1984, abandoned.

[30] Foreign Application Priority Data

Mar. 29, 1983 [JP] Japan ................................. 58-52944
Apr. 26, 1983 [JP] Japan ................................. 58-73293
Apr. 26, 1983 [JP] Japan ................................. 58-73294

[51] Int. Cl.$^4$ .............................................. H05K 7/20
[52] U.S. Cl. ...................... 361/386; 357/81; 361/400; 361/414
[58] Field of Search ............... 361/386, 387, 400, 403, 361/414, 412, 395, 399; 357/72, 80, 81; 174/16 HS

[56] References Cited

U.S. PATENT DOCUMENTS

| | | | |
|---|---|---|---|
| 3,205,469 | 9/1965 | Frank et al. | 361/412 |
| 3,777,220 | 12/1973 | Tatusko et al. | 361/386 |
| 4,245,273 | 1/1981 | Feinberg et al. | 361/386 |
| 4,398,208 | 8/1983 | Murano et al. | 357/80 |
| 4,498,122 | 2/1985 | Rainal | 361/414 |
| 4,509,096 | 4/1985 | Baldwin et al. | 361/387 |

FOREIGN PATENT DOCUMENTS 0106062 7/1982 Japan ............................. 357/80

OTHER PUBLICATIONS

Schuessler et al, "Plating Thru–Holes in Circuit Boards Having Dielectric Layers", IBM Technical Disclosure Bulletin vol. 13, No. 7 12/70 pp. 1831-1832.
Engel et al, "Pneumatically Controlled Assembler", IBM Technical Disclosure Bulletin vol. 23 No. 8 1/81 p. 3622.
Ing, "Chip Cooling", IBM Technical Disclosure Bulletin vol. 13 No. 5 10/70 p. 1060.
Ronkese, "Metal Wool Heat Stud", IBM Technical Disclosure Bulletin, vol. 20 No. 3 8/77 pp. 1122-1123.
Balderes et al, "Universal Air–Cooled Module, IBM Technical Disclosure Bulletin, vol. 21 No. 11 4/79 p. 14476.

Primary Examiner—A. D. Pellinen
Assistant Examiner—Gregory P. Thompson
Attorney, Agent, or Firm—Burns, Doane, Swecker & Mathis

[57] ABSTRACT

A multichip package is comprised of a substrate having a grid of input and output pins disposed on an under surface. Power supply and grounding wire layers are embedded in the substrate. An upper surface of the substrate has a plurality of thin wire layers separated by at least one insulating layer. A plurality of via holes in the insulating layer permit conductive interconnection of the wire layers. A plurality of leadless chip carriers on the upper have tape automated bonding leads that are inner lead bonded to the substrate. The chips are directly connected to the substrate and have a plurality of chip carrier terminals on an under surface that connect to the terminal pads. The chip carrier has a cover made of highly heat conductive material that contacts the back side of at least one mounted chip.

3 Claims, 6 Drawing Sheets

HIGH DENSITY LSI PACKAGE FOR LOGIC CIRCUITS

This application is a continuation of application Ser. No. 593,126, filed Mar. 26, 1984, now abandoned.

BACKGROUND OF THE INVENTION

This invention relates to a high density large scale integrated (LSI) package for logic circuits for use in data processing and communications systems.

LSI packages for logic circuits are indispensible to realize faster and more compact systems. As they become more compact, packages having active elements such as transistors require a structure to diffuse the heat generated by electric power consumption. A multi-chip package having such a heat diffusing structure is proposed in a paper by Hajime Nakamura et al. entitled "Manufacturing Technology of High Circuit Density Multi-Layer Substrates", IEEE, TRANSACTIONS ON COMPUTERS, HYBRIDS, AND MANUFACTURING TECHNOLOGY, VOL. CHMT-4, No. 2, June 1981 issue, pp. 333–337.

The substrate of the package illustrated in FIG. 10 page 337 of this paper is composed of an alumina ceramic. Multiple signal wiring layers and a power bus layer are formed on the surface of the substrate. An IC chip is mounted over the substrate is connected to these wiring layers. To the undersurface of the substrate a heat sink is attached for diffusing the heat from the IC chip.

The multi-layer wiring substrate of this structure has the following disadvantages.

First, for each of the insulating layers among the multiple wiring layers, printed and baked inorganic dielectric paste of glass ceramic type is used. The relative dielectric constant $\epsilon r$ of inorganic dielectric paste usually ranges between 8 and 9. Accordingly, the signal propagation delay time td per unit length of the signal wiring formed on this insulator is calculated from $$td = \frac{\sqrt{\epsilon r}}{C}$$

(where C is the velocity of light, which is $3.0 \times 10^{10}$ cm/sec). Using this expression, td is found to be 9 nanoseconds (ns)/m. Thus, the signal propagation delay time of this wiring is more than double that of usual coaxial cables, which is 4 ns/m.

Second, the conductor wiring layers are formed, for instance, of gold paste, by screen printing. As a result, the wiring width and wiring pitch can be no smaller than 50 microns and 100 microns, respectively.

Third, the heat generated by the IC chip is diffused to the heat sink on the other side through the alumina ceramic substrate. The alumina ceramic substrate usual is about 2 mm thick so as to be strong enough to endure the fabricating stress given for the conductive and dielectric layers due to the temperature change in the process of manufacturing a whole substrate. The heat from the IC chip is prevented from being efficiently diffused to the heat sink by the thick alumina substrate.

Fourth, a heat sink is attached to the entire under surface of the substrate so that it is impossible to form input and output terminals on that under surface when input and output terminals are needed for the multi-chip package. Therefore, the input and output terminals must be formed on the upper surface of the alumina ceramic substrate or the surface on which the wiring and IC chip are mounted. However, since the wiring and IC chip are mounted on that upper surface, terminals cannot be provided on the whole surface of the substrate. Accordingly, this multi-chip package has the disadvantage of being unable to allow the formation of many input and output terminals.

SUMMARY OF THE INVENTION

One primary object of the present invention, therefore, is to provide a high density multi-chip package ensuring a high signal propagation speed by the application of fine wiring, which is free from the above-mentioned disadvantages.

Another object of the invention is to provide a multi-chip package with a high heat diffusing efficiency by mounting leadless chip carriers in a face-down position.

According to one aspect of the invention, there is provided a multichip package which comprises an alumina ceramic substrate having, on its under surface, a plurality of input and output pins erected in a grid form and, inside of the substrate, a plurality of power supply and ground wiring layers and a plurality of through-hole wires for conductively connecting each of said input and output pins provided on the under surface of the substrate to said upper surface of the substrate. Multiple wiring layers are provided over the upper surface of said alumina ceramic substrate. A plurality of thin-film conductive wiring layers with an insulating layer or layers of high molecular weight organic polymer sandwiched between said thin-film conductive wiring layers to insulate these layers from each other. A plurality of via-holes in said insulating layer or layers conductively connect said wiring layers to one another, and a plurality of surface terminal pads for connecting leadless chip carriers are formed over the top layer. The multiple wiring layers are structured so that each of the through-hole wires in the alumina ceramic substrate and each of said surface terminal pads can be mutually connected in any desired combination through said thin-film conductive wiring layers and via-holes. Additionally, a plurality of leadless chip carriers is arranged over the upper surface of said multiple wiring layers. The chip carriers are equipped inside with tape automated bonding (TAB) IC chips face down, each having a chip carrier substrate with a plurality of grid-shaped chip carrier terminals provided on the under surface of the substrate and a chip carrier cover made of a highly heat-conductive material, with the dies of the IC chips directly connected to it, wherein each of said upper surface terminal pads of the wiring layers and each of the chip carrier terminals provided on the under surface of the substrate are mutually connected.

BRIEF DESCRIPTION OF THE DRAWINGS

Other features and advantages of the present invention will now be described in more detail in conjunction with the accompanying drawings, in which.

In the drawings, the same reference numerals represent respectively the same structural elements.

DETAILED DESCRIPTION OF THE INVENTION

Figure 1:
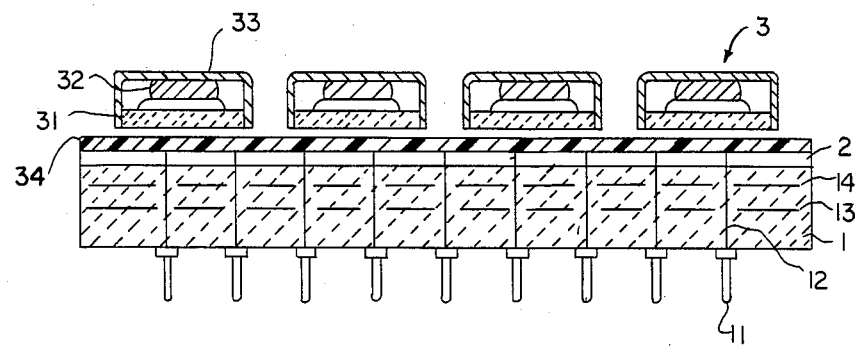
FIG. 1 illustrates a side view of one embodiment of the invention.

Referring to FIG. 1, one embodiment of the invention comprises an alumina ceramic substrate 1, multiple wiring layers 2 of high organic polymer, formed over the upper surface of this substrate 1, and a plurality of leadless chip carriers 3.

Figure 5:
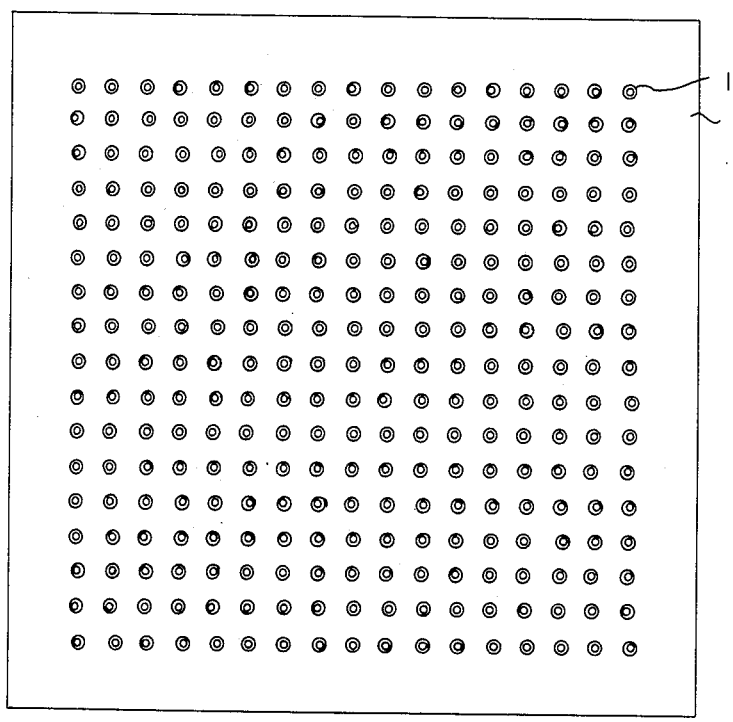
FIG. 5 illustrates the under surface of the substrate shown in FIG. 1.

Turning now to FIG. 5, a plurality of input and output terminal pins 11 are formed as a grid on the under-surface of the alumina ceramic substrate 1. The insertion of the input and output terminal pins 11 to the alumina ceramic substrate 1 is achieved by nickel-plating metallic bases, primarily made of tungsten, on the alumina ceramic substrates 1. Solder, such as silver-copper eutectic brazing solder is then applied over the plating, and, with the metallic terminal pins 11 pressed against the bases, the solder is melted and hardened.

Because the input and output pins 11 are arranged in a grid form over the area of the under surface of the substrate 1 far more pins may be provided than where such pins are arranged only on the peripheries of the substrate 1.

Figure 2:
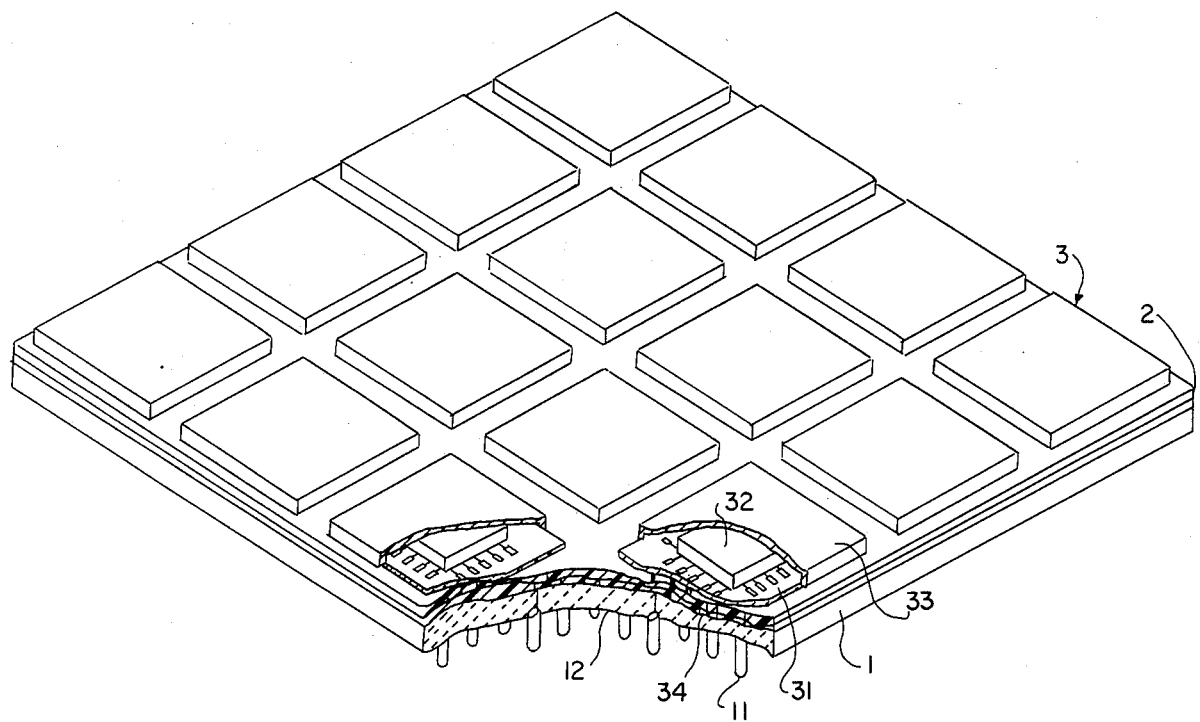
FIG. 2 illustrates a perspective view of a multi-chip package according to the invention.

Referring to FIG. 2, through-hole wires 12 penetrate the substrate 1 from the under surface to the upper surface of the substrate. These wires 12 electrically connect the input and output terminals 11 to wiring formed over the upper surface of said substrate 1.

Referring again to FIG. 1, a power supply wiring layer 13 and a ground wiring layer 14 are connected through selected pins 11 to a power supply and ground, respectively. Wiring layers 13 and 14 provide power and ground potentials for IC chips connected to the upper surface of the substrate 1.

The input and output pins 11 that are used as signal pins are connected by way of the through-hole wires 12 and the wiring on the upper surface of the substrate 1 to wiring within the multiple wiring layers 2. The input and output pins 11, that are used for power supply and grounding are respectively connected to the power supply wiring layer 13 and the ground wiring layer 14 within the substrate 1.

The signal wiring within the multiple wiring layers 2 connects chip carrier terminals 34 of the leadless chip carriers 3 in some combinations. This signal wiring also connects some signal terminals of the leadless chip carriers 3 to some of the input and output pins 11.

Each leadless chip carrier 3 is provided with a chip carrier substrate 31, an IC chip 32 and a chip carrier cover 33. The IC chip is lead-bonded face down to the substrate 31, and is die-bonded to the cover 33. The chip carrier cover 33 is made of either a highly heat-conductive metal, such as ferro-nickel alloy or cobalt-nickel alloy, or a highly heat-conductive insulator, such as beryllia. Therefore, the heat generated by the IC chip 32 can be very efficiently transmitted to the surface of the cover 33.

The mechanism for diffusing heat from the chip carriers 3 will be described in detail below with reference to FIGS. 6 and 7.

Figure 6:
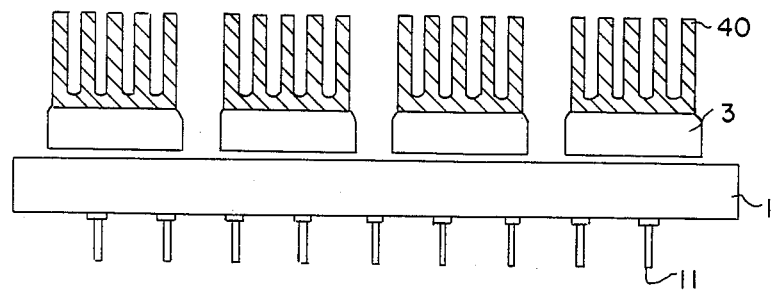
FIG. 6 illustrates one example of chip carrier cooling mechanism with a cross-sectional view of the cooling elements and a side elevational of the multichip device.

Referring to FIG. 6, forced flows of air through gaps between the finely spaced fins of heat sinks 40 fastened over the chip carriers 3 efficiently diffuse the heat generated by the IC chips in the chip carriers 3.

Figure 7:
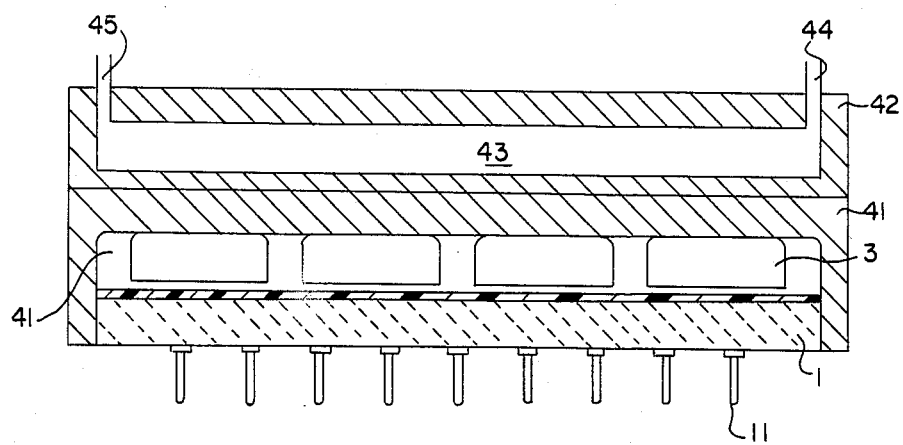
FIG. 7 illustrates another example of chip carrier cooling mechanism.

FIG. 7 illustrates an example of a cooling mechanism using liquid. A heat diffusing cover 41 is fitted to the alumina ceramic substrate 1 and is in either direct or almost direct contact with the chip carriers 3. Further, a heat transfer board 42 is in contact with this cover 41. The board 42 is provided with a channel 43 for coolant flow, an inlet 44 for supplying the coolant into channel 43 and an outlet 45 for the coolant. This structure enables the heat generated by the IC chips in the chip carriers 3 to be transmitted to the coolant in the channel 43 via the cover 41 and the board 42, and thereby to effectively cool the IC chips.

Further in the example of FIG. 7, a heat-conductive filler 46 fills the gap between the cover 41 and the substrate 1.

By inserting a highly heat-conductive filler between the chip carriers 3 and the cover 41, the cooling performance can be further improved.

The multi-chip package according to the present invention, as illustrated in FIGS. 1 and 7, can provide the following effects:

First, the insulating layers for the multiple wiring layers are made of a high molecular weight organic polymeric insulator, more specifically polyimide. The specific dielectric constant of this material is as low as 3.5. Accordingly, the signal propagation time of the signal wiring is, from the above-cited equation of $$td = \frac{\sqrt{er}}{C},$$

td=6.2 ns/m, improved by 1.6 times over the 10 ns/m of the prior art embodiment previously cited.

Second, the temperature required for the formation of polyimide insulating layers is 400° C. Therefore, there can be formed wiring of a thinner film thickness than gold paste wiring, such as that produced by plating a chrome-evaporated film with copper and further forming another chrome-evaporated film over the plate film. Accordingly, the wiring width and pitch can be as small as 20 and 50 microns, respectively. This is much smaller than the 50-micron width and 100-micron pitch minimums possible with thick-film wiring with gold paste, making possible about twice as dense wiring.

Third, the heat generated by the IC chips 32 is diffused into a cooling mechanism in the upper part of the substrate via the chip carrier covers 33, which are made of highly heat-conductive metal. If the chip carrier covers 33 are made of cobalt-nickel alloy, they can be strong enough even at a thickness of as small as 0.5 mm. Therefore, the thermal resistance encountered up to the cooling mechanism can be reduced to about a quarter of what is present in the alumina substrate of prior art because, in contrast to the prior art alumina substrate which would require a plate thickness of, say, 2 mm, the chip carrier covers 33 according to the present invention need not be more than 0.5 mm thick, and the alumina substrate and that of cobalt-nickel alloy are substantially equal in heat conductivity.

Fourth, input and output pins 11 can be provided over the entire area of the underface of the substrate 1. This has the advantage that the area in which input and output terminals can be arranged is far greater than where terminals could be arranged only on the peripheries of the upper surface of the substrate.

Now, with reference to FIGS. 1 through 4, the embodiment of the present invention will be described in further detail.

Referring first to FIGS. 1 and 2, within each of the leadless chip carriers 3, the IC chip 32 is lead-bonded face down onto the chip carrier substrate 31 and die-bonded to the chip carrier cover 33. Further, the chip carriers 3 are connected to inner wiring within the multiple wiring layers 2 by way of chip carrier terminals 34. The input and output pins 11 on the under-face of the substrate 1 are connected to the inner wiring within the multiple wiring layers 2 through the through-hole wires 12.

Figure 3:
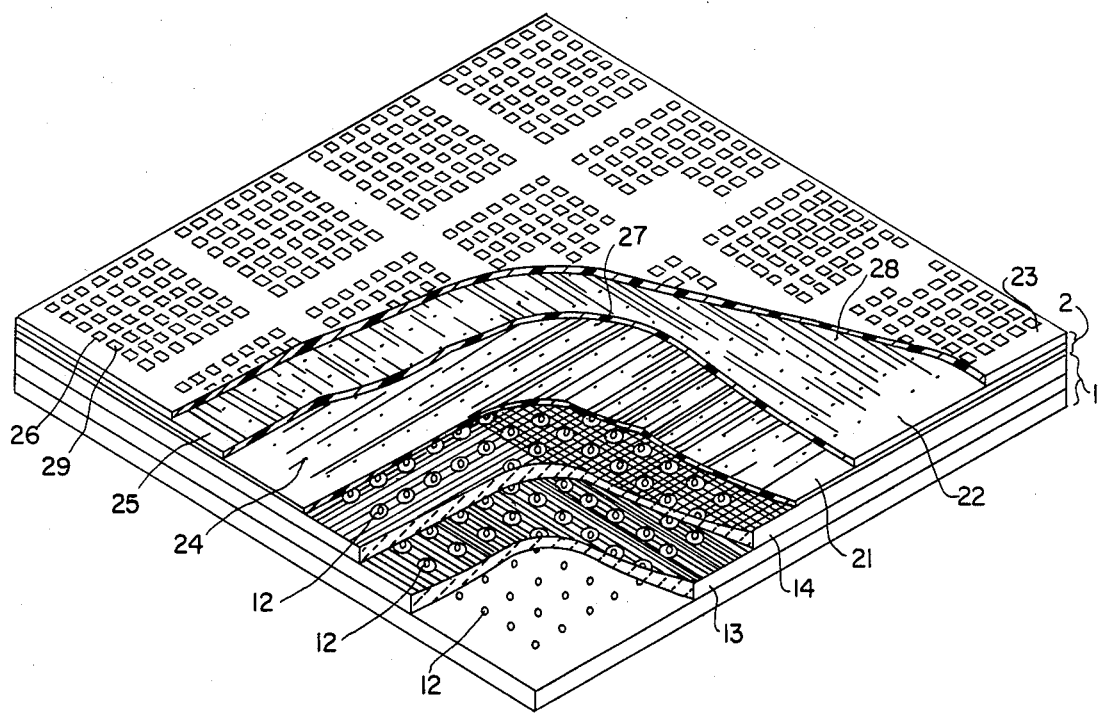
FIG. 3 is a cut-away view illustrating the alumina ceramic substrate shown in FIG. 1.

Referring to FIG. 3, the substrate 1 contains a power supply wiring layer 13, a ground wiring layer 14 and the through-hole wires 12 connecting the input and output pins 11 and the multiple wiring layers 2. Reference can be made to IEEE Transactions on Components, Hybrids, and Manufacturing Technology, Vol. CHMT-3, No. 1, March 1980, the section on "Process", p. 89 and FIG. 3, p. 91 as to the fact that such an alumina ceramic substrate 1 can be formed by the known method of multi-layer lamination of unfired alumina sheets. The multiple wiring layers 2 comprise a first wiring layer further having thin-film conductive wiring 24 formed over an insulating film 21 made of a high molecular weight organic polymer and a plurality of via-holes 27 for connection to the through-hole wires of the layer underneath. A second wiring layer has a thin-film conductive wiring 25 similarly formed over an insulating film 22 and a plurality of via-holes 28 for connection of the wiring 24 and wiring 25. A third wiring layer has an insulating film 23, a plurality of terminal pads 26 for connecting the terminals 34 of the carriers 3 on the surface of the film 23, and a plurality of via-holes 29 for connecting the pads 26 and the wiring 25. Therefore, the multiple wiring layers 2 can connect the terminals 34 of any desired ones of the carriers 3 to one another, and any desired terminal 34 to any desired input or output pin 11.

Figure 4:
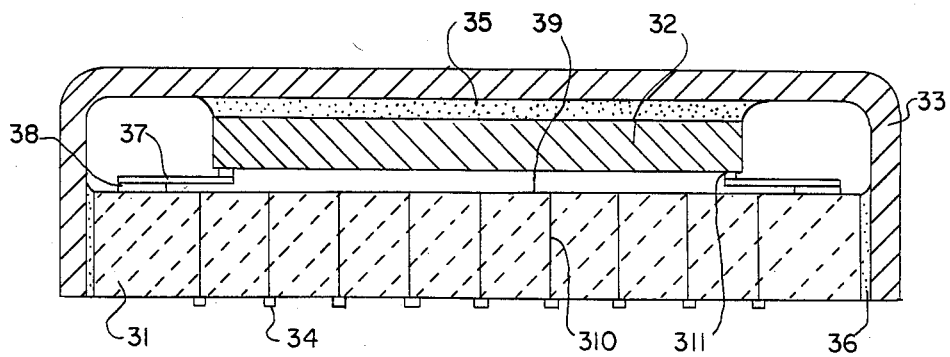
FIG. 4 illustrates one example of the leadless chip carrier shown in FIG. 1.

Referring now to FIG. 4, in each of the IC chips 32 has known tape automatic bonding (TAB) type leads 37 and are inner lead-bonded to terminal bumps 311. Accordingly, the leadless chip carrier illustrated in FIG. 4 is assembled by the following procedure: first, an IC chip 32 to which leads 37 are bonded is placed in a face-down position on the chip carrier substrate 31; next, after the relative positions of the leads 37 and outer lead bonding pads 38 on the substrate 31 are adjusted, all the leads are bonded collectively. Thus, the bumps 311 are conductively connected to respective chip carrier terminals 34 by way of the pads 38, connecting wires 39 and chip carrier through-hole wires 310.

Over the chip carrier cover 33, to which a die bonding adhesive 35 and a substrate adhesive 36 have been applied, is placed the chip carrier substrate 31. The IC chip 32 is bonded to the substrate face down, so that the cover 33 may come into contact with the die of the IC chip 32. Finally, heat needed for hardening the adhesives 35 and 36 is impressed to complete the bonding. In this manner, the high-density, high-performance multichip package can be produced by using the leadless chip carriers which are compact and highly efficient in heat diffusion.

Figure 8:
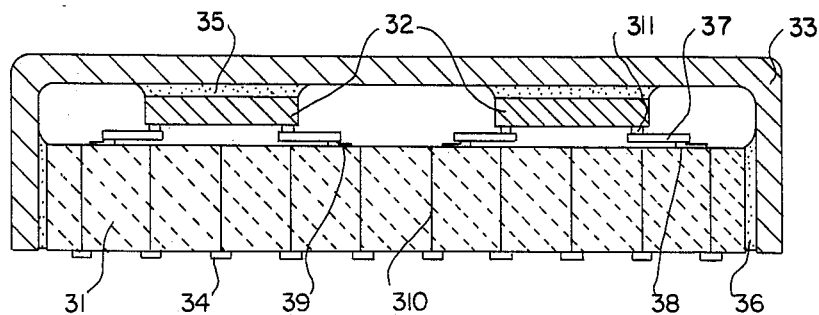
FIG. 8 illustrates another example of the chip carrier.

Further, another example of chip carrier pertaining to the present invention will be described with reference to FIG. 8. A plurality of IC chips 32 are connected to a chip carrier substrate 31. This chip carrier comprises the substrate 31, the IC chips 32, a chip carrier cover 33, chip carrier terminals 34, leads 37, bonding pads 38, terminal bumps 311, a substrate adhesive 36, a die bonding adhesive 35, chip carrier through-hole wires 310 and connecting wires 39. A plurality of bonding pads 38, equal in number to the IC terminals, are formed on the surface of the substrate 31. A lead 37 of one of the IC chips 32 is bonded to each of these pads 38.

A plurality of connecting wires 39 are formed on the surface of the substrate 31. The wires 39 are connected to each of the pads 38. Each of these wires 39 is also connected to one of the chip carrier terminals 34 via one of the through-hole wires 310. Connected directly to each other at this point are a plurality of IC chips 32 and the chip carrier terminals 34. The connection of one IC chip and another IC chip can also be achieved by way of a wiring layer within the substrate 31.

Figure 9:
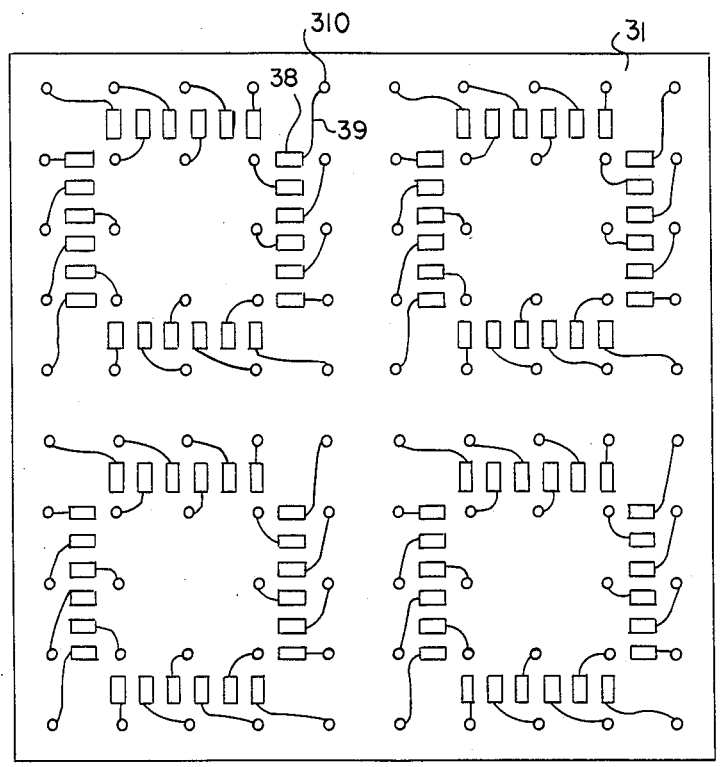
FIG. 9 illustrates the upper surface of the substrate shown in FIG. 8.
Figure 10:
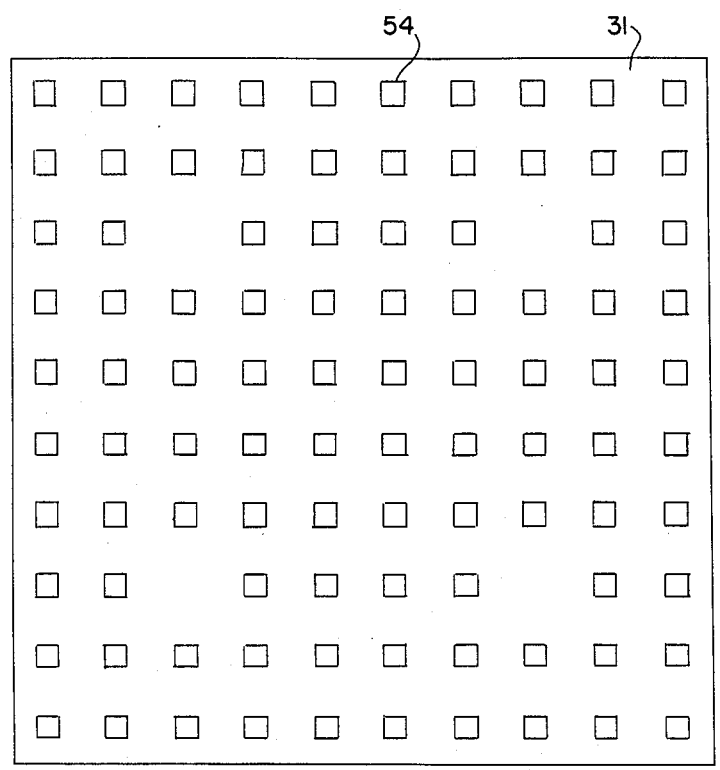
FIG. 10 illustrates the under surface of the substrate shown in FIG. 8.

Referring now to FIGS. 9 and 10, each of the bonding pads 38 is connected to one of the wires 310 via a connecting wire 39. Further, each of these wires 310 penetrates the substrate 31 and is connected to one of the chip carrier terminals 34. The terminal 34 can be used for external connection. The chip carrier terminals 34 are arranged in a grid form on the under-surface of the substrate 31. Accordingly, it is possible to have many terminals in a high density arrangement. By utilizing this high terminal density to mount a plurality of multi-terminal IC chips on each chip carrier, there can be achieved high-density mounting in a very compact form.

Figure 11:
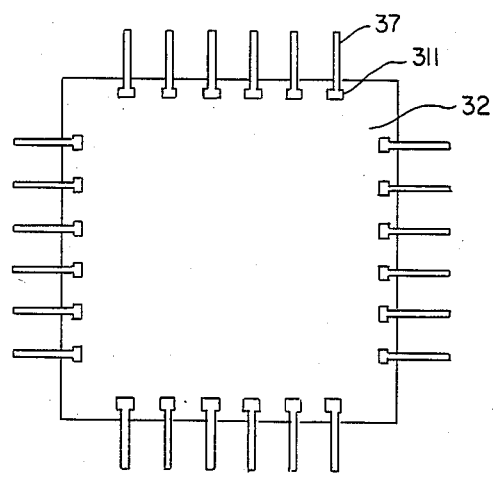
FIG. 11 illustrates how the leads of the IC chips shown in FIG. 8 are connected.

Next referring to FIG. 11, the leads 37 of the IC chip 32 are connected to corresponding terminal bumps 311 of the IC chip 32. The leads 37 can be produced by exposing to light, developing and etching copper foil over a film having sprocket holes by photolithography. After the leads 37 formed over the film are gold-plated, the leads 37 are bonded collectively to the terminal bumps 311 on the IC chip 32 by the known TAB technique. After that, each part of the film having supported the leads 37 is cut off to give an IC chip with TAB leads as shown in FIG. 11.

Figure 12:
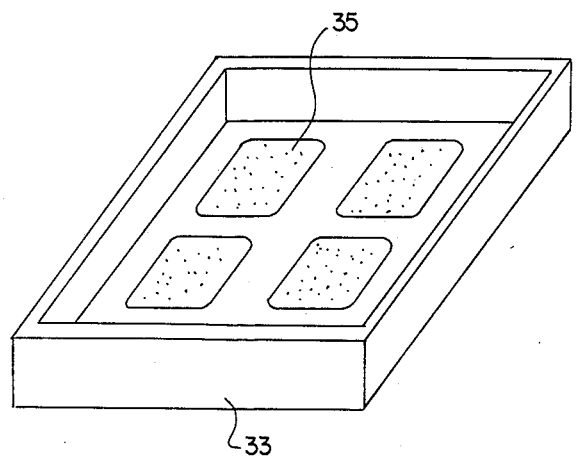
FIG. 12 illustrates the inside of the cover shown to in FIG. 8.

Referring to FIG. 12, within the chip carrier cover 33 used in this embodiment is applied the die bonding adhesive 35 for attaching the body of each IC chip 32. This adhesive may be a highly heat-conductive resin adhesive which can be hardened by impressing with heat of a predetermined temperature for a fixed length of time. For example a silver filler electrically conductive epoxy adhesive may be used which is hardened by impressing with heat of 150° C. for 30 minutes.

Referring again to FIG. 8, each of the leads 37 of the IC chip 32 is bonded to one of the pads 38 of the substrate 31. The body of the IC chip 32 is fastened to the inside of the cover 33. Such a chip carrier is assembled in the following sequence. First, the IC chips 32, to which all its leads 37 have been connected in advance, are placed face down on the ceramic substrate 31, and each of the leads 37 is aligned to the corresponding bonding pad 38. Next, the leads 37 and the respectively corresponding bonding pads 38 are collectively bonded to each other. The cover 33 is the placed over the surface of the substrate 31, on which the IC chips 32 are mounted, and the adhesive 35 and the body of each IC chip 32 are brought into contact. In this condition, the adhesive 35 is hardened by impressing with heat of 150° C. for a predetermined length of time, for instance 30 minutes, to bond together the cover 33 and each IC chip 32. Finally the epoxy adhesive 36 is injected between the mutually contacting faces of the substrate 31 and the cover 33, and is heated at 150° C. for 90 minutes to bond them together, thus completing the assembly of the chip carrier.

The chip carrier can realize the advantages of having many input and output terminals: excellent heat diffusing performance and very small size.

The multi-chip package according to the present invention, comprising a ceramic substrate with input and output pins over its under surface and high-speed multi-layer wiring made of organic high polymer on its upper surface, a leadless chip carrier excelling in heat diffusing performance to which IC chips can be directly die-bonded, and a cooling function arranged in the upper part of said chip carrier, has the benefit of making it possible to realize a high-speed, high-density and highly heat-diffusing multi-terminal multi-chip package and chip carrier.

What is claimed is:

1. A multi-chip package comprising:
    an alumina ceramic substrate with an upper and under surface and having, on its under surface, a plurality of input and output pins disposed in a grid pattern and, inside of the substrate, at least one power supply and at least one ground wiring layer and a plurality of through-hole wires for conductively connecting each of said input and output pins on the under surface of the substrate to the upper surface of the substrate;
    a plurality of thin-film conductive wiring layers disposed over the upper surface of said alumina ceramic substrate, each of said wiring layers including a plurality of conductive wirings;
    a plurality of insulating films disposed over the upper surface of the alumina substrate, at least one of said insulating films being a high-molecular-weight organic polymer having a dielectric constant relatively lower than alumina sandwiched between a first wiring layer and a second wiring layer of said plurality of thin-film conductive wiring layers for insulating the wirings of said first wiring layer from the wirings of said second wiring layer and having a plurality of via-holes for conductively connecting said first wiring layer to said second wiring layer, another of said insulating films forming a top layer over said wiring layers and having a plurality of surface terminal pads formed thereon for connection to leadless chip carriers positioned above the top layer, said another of said insulating films having a plurality of via-holes for connecting said pads to said conductive wirings, and a second other of said insulating films provided on said upper surface of said alumina ceramic substrate and having a plurality of via-holes for connecting said conductive wirings to said plurality of through-hole wires in the alumina ceramic substrate, said plurality of insulating films and plurality of conductive wiring layers being so structured that each of said through-hole wires in the alumina ceramic substrate and each of said surface terminal pads can be mutually connected in any desired combination through said thin-film conductive wiring layers and via holes; and
    a plurality of leadless chip carriers positioned above the top layer, each carrier including an IC chip disposed face down within said carrier and said chip having a plurality of flexible leads, a chip carrier substrate having a plurality of chip carrier terminals disposed in a grid pattern on its under surface for connection to said surface terminal pads and a plurality of bonding pads on its upper surface for connection to said flexible leads, and a chip carrier cover made of a highly heat-conductive material, wherein the die of the chip is directly connected to said chip carrier cover by a highly heat-conductive adhesive.

2. A leadless multi-chip carrier comprising:
    a substrate;
    a plurality of bonding pads mounted on an upper surface of said substrate and means for bonding the leads of a plurality of IC chips to said bonding pads;
    a plurality of terminal pads formed on an under surface of said substrate and arranged in a grid form for connection to another substrate;
    conductive wiring connecting said bonding pads to each other;
    via-hole wiring connecting said bonding pads with said terminal pads;
    a cover covering the upper surface and all four side surfaces of said substrate, said cover being bonded to said side surfaces; and
    at least one IC chip having a plurality of flexible tape automatic bonding leads each bonded to one of said bonding pads on the upper surface of said substrate, the body of the chip being attached to the inside of said cover by a highly heat-conductive adhesive.

3. A leadless multi-chip carrier, as claimed in claim 2, having only one IC chip.

* * * * *